(12) United States Patent
Piret et al.

(10) Patent No.: US 7,464,323 B2
(45) Date of Patent: Dec. 9, 2008

(54) ALGEBRAIC GEOMETRIC CODE ADAPTED TO ERROR BURSTS

(75) Inventors: Philippe Piret, Cesson-Sevigne (FR); Frédéric Lehobey, Rennes (FR); Philippe Le Bars, Thorigne-Fouillard (FR); Frédérique Ehrmann-Patin, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 282 days.

(21) Appl. No.: 10/746,144

(22) Filed: Dec. 29, 2003

(65) Prior Publication Data

US 2004/0194006 A1 Sep. 30, 2004

(30) Foreign Application Priority Data

Dec. 26, 2002 (FR) .................................. 02 16714
Apr. 16, 2003 (FR) .................................. 03 04767

(51) Int. Cl.
*H03M 13/00* (2006.01)

(52) U.S. Cl. ....................... 714/781; 714/785; 714/752; 375/239

(58) Field of Classification Search ................. 714/752, 714/784, 781, 788, 800, 793; 375/239; 370/319
See application file for complete search history.

(56) References Cited

U.S. PATENT DOCUMENTS

| | | | | |
|---|---|---|---|---|
| 4,486,882 A * | 12/1984 | Piret et al. | .................. | 714/788 |
| 5,905,739 A | 5/1999 | Piret et al. | ................ | 371/37.01 |
| 6,332,005 B1 | 12/2001 | Pehkonen | .................... | 375/259 |
| 6,438,112 B1 | 8/2002 | Piret et al. | .................. | 370/298 |
| 6,543,021 B1 | 4/2003 | Piret | ........................... | 714/752 |
| 6,578,170 B1 | 6/2003 | Piret et al. | .................. | 714/758 |
| 6,578,171 B1 | 6/2003 | Braneci et al. | .............. | 714/786 |
| 6,638,318 B1 | 10/2003 | Piret et al. | .................. | 718/781 |
| 6,766,489 B1 | 7/2004 | Piret et al. | .................. | 714/755 |
| 2002/0041640 A1 | 4/2002 | Le Bars et al. | ............. | 375/340 |
| 2002/0065859 A1 | 5/2002 | Le Bars et al. | ............. | 708/109 |
| 2002/0071496 A1 | 6/2002 | Ehrmann | .................... | 375/295 |
| 2002/0099997 A1 | 7/2002 | Piret | ........................... | 714/781 |
| 2003/0177430 A1 | 9/2003 | Piret | ........................... | 714/751 |

(Continued)

FOREIGN PATENT DOCUMENTS

WO WO 2004/047306 A1 6/2004

(Continued)

OTHER PUBLICATIONS

T. Hoholdt et al., "On the Decoding of Algebraic-Geometric Codes", IEEE Transactions on Information Theory, IEEE Inc., New York, U.S., vol. 41, No. 6, pp. 1589-1614, Nov. 1995.

(Continued)

*Primary Examiner*—Guy J Lamarre
(74) *Attorney, Agent, or Firm*—Fitzpatrick, Cella, Harper & Scinto

(57) ABSTRACT

The present invention concerns channel codes particularly well adapted to transmission in channels in which errors tend to occur in bursts. Moreover, the codes according to one embodiment of the invention using an algebraic geometric curve are easy to decode and have a relatively high minimum distance. The invention also relates to the corresponding encoding and decoding methods, as well as the devices and apparatuses adapted to implement those methods. Application is in particular to mass storage, and to systems of communication by OFDM.

31 Claims, 3 Drawing Sheets

U.S. PATENT DOCUMENTS

2004/0117719 A1     6/2004    Lehobey et al. .............. 714/781
2005/0015704 A1     1/2005    Piret et al. ................... 714/781

FOREIGN PATENT DOCUMENTS

WO     WO2004047306     *    6/2004

OTHER PUBLICATIONS

I. Blake et al., "Algebraic-Geometry Codes", IEEE Transactions on Information Theory, vol. 44, No. 6, pp. 2596-2618, Oct. 1998.

R.E. Blahut, "Theory and Practice of Error-Control Codes", Addison-Wesley, Reading, MA, pp. 162-193, 1983.

par J.H. Van Lint, "Algebraic Geometric Codes" in Coding Theory and Design Theory, $1^{st}$ part, IMA Volumes Math Appl., vol. 21, Springer-Verlag, Berlin, pp. 137-162, 1990.

S. Miura, "Hyperelliptic Codes II", $12^{th}$ Symposium on Information Theory and its Applications-Sitga '89, Inuyama, Japan, pp. 377-382, Dec. 1989.

Hoholdt et al., "Handbook of Coding Theory", Elsevier Science B.V., 1998, pp. 871-961.

Matsumoto, "The $C_{ab}$ Curve", Mathematics Subject Classification, http://tsk-www.ss.titech.ac.jp/~ryutaroh/cab.html., Dec. 1998, pp. 1-4.

Miura et al., "Geometric-Goppa Codes on Some Maximal Curves and Their Minimum Distance", Institute of Electronics, Information and Communication Engineers Meeting of Technical Group on Information Theory, Mar. 1993, 2 pages.

Feng et al., "Reflections on the Decoding of Algebraic-Geometric Codes up to the Designed Minimum Distance", 1998, pp. 1-11.

Kamiya et al., "On a recursive decoding algorithm for certain Geometric-Goppa codes", C&C Information Technology Research Laboratories, NEC Corporation, Japan, 8 pages.

Miura et al., "On the Minimum Distance of Codes from some Maximal Curves", Technical Report of the Institute of Electronics, Information and Communication Engineers, Mar. 1993, 6 pages.

Kamiya et al., "On application of the Sakata algorithm to Modified decoding algorithm for certain Geometric-Goppa codes", C&C Information Technology Research Laboratories, NEC Corporation, Japan, 8 pages. No date.

* cited by examiner

ALGEBRAIC GEOMETRIC CODE ADAPTED TO ERROR BURSTS

The present invention concerns communication systems in which, in order to improve the fidelity of the transmission, the data to be transmitted are subjected to a channel encoding. More particularly it relates both to encoding methods and to decoding methods, and also to the devices and apparatuses adapted to implement those methods.

It will be recalled that so-called "channel" encoding consists, when the "codewords" sent to the receiver are formed, of introducing a certain amount of redundancy in the data to be transmitted. More particularly, by means of each codeword, the information is transmitted that is initially contained in a predetermined number k of symbols taken from an "alphabet" of finite size q; on the basis of these k information symbols, calculation is made of a number n of symbols belonging to that alphabet, so as to form codewords $\underline{v} = [v_1, v_2, \ldots v_n]$. The set of codewords obtained when each information symbol takes some value in the alphabet constitutes a sort of dictionary referred to as a "code" of "dimension" k and "length" n.

When the size q of the alphabet is a power of a prime number, the alphabet can be given the structure of a so-called "Galois field" denoted $F_q$, of which the non-zero elements may conveniently be identified as each being equal to $\gamma^{i-1}$ for a corresponding value of i, where $i = 1, \ldots, q-1$, and where $\gamma$ is an element of $F_q$ chosen from the so-called "primitive" elements of that field. Where the alphabet is a Galois field, certain codes may conveniently be associated with a matrix H of dimension $(n-k) \times n$ known as a "parity matrix", defined over $F_q$: a given word $\underline{v}$ of length n is a codeword if, and only if, it satisfies the relationship: $H \cdot \underline{v}^T = 0$ (where the exponent T indicates the transposition); the code is then said to be "orthogonal" to the matrix H. These codes, which are termed "linear codes", will be the only codes considered further on.

At the receiver, the associated decoding method then judiciously uses this redundancy to detect any transmission errors and if possible to correct them. There is a transmission error if the difference $\underline{e}$ between a received word $\underline{r}$ and the corresponding codeword $\underline{v}$ sent by the transmitter is non-zero.

More particularly, the decoding is carried out in two main steps.

The first step consists of associating an "associated codeword" $\hat{\underline{v}}$, which is an estimated value of the codeword $\underline{v}$, with the received word $\underline{r}$. To do this, the decoder first of all calculates the vector of "error syndromes" $H \cdot \underline{r}^T = H \cdot \underline{e}^T$. If the syndromes are all zero, it is assumed that no transmission error has occurred, and the "associated codeword" $\hat{\underline{v}}$ will then simply be taken to be equal to the received word $\underline{r}$. If that is not the case, it is thereby deduced that certain symbols in the received word are erroneous, and a correction algorithm is then implemented which is adapted to estimate the value of the error $\underline{e}$; the algorithm will thus provide an estimated value $\hat{\underline{e}}$ such that $\hat{\underline{v}} = \underline{r} - \hat{\underline{e}}$ is a codeword, which will then constitute the "associated codeword".

The second step simply consists in reversing the encoding method. In the ideal situation in which all the transmission errors have been corrected, the initial information symbols are thereby recovered.

The purpose of an error correction algorithm is to associate with the received word the codeword situated at the shortest Hamming distance from that received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to $INT[(d-1)/2]$ (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

Among known codes, "Reed-Solomon" codes may be cited, which are reputed for their efficiency (for a definition of Reed-Solomon codes, reference may be made to the work by R. E. Blahut entitled "*Theory and practice of error-control codes*", Addison-Wesley, Reading, Mass., 1983). These codes are defined over $F_q$, and their minimum distance d is equal to $(n-k+1)$. To decode them, a so-called "Berlekamp-Massey" algorithm is usually employed for the detection of the erroneous positions in a received word, and a so-called "Forney" algorithm for the correction of the corresponding erroneous symbols (these algorithms are described in the work mentioned above).

For modern information carriers, for example on hard disks, CD's ("compact discs") and DVD's ("digital video discs"), it is sought to increase the density of information. When such a carrier is affected by a physical defect such as a scratch, a high number of information symbols may be rendered unreadable. This problem may nevertheless be remedied by using a very long code. However, Reed-Solomon codes have the particularity that the length n of the codewords is necessarily less than or equal to the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes.

In particular so-called "algebraic geometric codes" or "Goppa geometric codes" have recently been proposed (see for example "*Algebraic Geometric Codes*" by par J. H. van Lint, in "*Coding Theory and Design Theory*" 1st part, *IMA Volumes Math. Appl.*, volume 21, Springer-Verlag, Berlin, 1990). These codes, also defined over a Galois field $F_q$, are constructed on the basis of an algebraic equation with two unknowns X and Y. The solutions to this algebraic equation may be considered as the coordinates (x,y) of points on an "algebraic curve". To define a parity matrix, an ordered set is first of all constituted, termed a "locating set", based on n such points of which all the coordinates are finite; then each row of the parity matrix is obtained by calculating the value of one judiciously chosen function of X and Y for each element of that locating set. An algebraic geometric code of length n is thus obtained.

An important parameter of such a curve is its "genus" g. In the particular case where the curve is a simple straight line (the genus g is then zero), the algebraic geometric code reduces to a Reed-Solomon code. In certain cases, algebraic geometric codes make it possible to achieve a length equal to $(q + 2g\sqrt{q})$, which may be very high; for example, with an alphabet length of 256 and a genus equal to 120, codewords are obtained of length 4096. It should moreover be noted that algebraic geometric codes have a minimum distance d greater than or equal to (n−k+1−g).

Algebraic geometric codes are advantageous as to their minimum distance, and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capacity of the decoder. (see for example the article by Tom Hoholdt and Ruud Pellikaan entitled "On the Decoding of Algebraic-Geometric Codes", IEEE Trans. Inform. Theory, vol. 41 no. 6, pages 1589 to 1614, Nov. 1995).

Like all codes, algebraic geometric codes may be "modified" and/or "shortened". It is said that a given code $C_{mod}$ is a "modified" version of the code C if there is a square non-singular diagonal matrix A such that each word of $C_{mod}$ is equal to v·A with v being in C. It is said that a given code is a "shortened" version of the code C if it comprises solely the words of C of which, for a number k of predetermined positions, the components are all zero: as these positions are known to the receiver, their transmission can be obviated, such that the length of the shortened code is (n−R). In particular, it is common to shorten an algebraic geometric code by removing from the locating set, where possible, one or more points for which the x coordinate is zero.

The object of the invention, inter alia, is to provide a code making it possible to correct a relatively high number of transmission errors in an economic manner, particularly where transmission errors have a tendency to occur in "error bursts" during the transmission of encoded symbols (it should be recalled that an "error burst" is a series of errors of which the frequency is high with respect to the mean frequency of errors over the channel considered; such error bursts are observed both in certain radio transmissions and in certain recordings on hard disk.)

Thus the creators of the present invention wondered whether, on determining the properties of the code used to transmit information over a given channel, it might be possible to take into account the characteristics of the channel envisaged to choose a well-adapted code. In particular, said creators considered the channels in which the data to transmit are grouped in blocks of predetermined length, and in which the transmission error rate per item of data transmitted is essentially constant within the same block; on other words, such channels are physically characterized in that, most often, transmission "noises" affect the data per block, and may affect different blocks differently; thus, for certain blocks, the probability of error can be very low or even zero, but for certain other blocks the probability of error can be very high and even close to (q−1)/q.

For such channels, it is advantageous to use a communication system with multiple carriers known as "OFDM" (which stands for "Orthogonal Frequency Division Multiplexing"). OFDM is particularly useful in environments in which the received signal is the sum of multiple transmitted signals which have undergone various reflections, and thus various phase shifts and attenuations, over their path between transmitter and receiver. Interference effects result from this which it is necessary to correct in order to guarantee good reception quality. OFDM achieves this objective by dividing the total bandwidth into a certain number of portions allocated to "subcarriers" of different frequency, such that the OFDM signal results from the superposition of the individual signals, which are mutually orthogonal, associated with those subcarriers.

More particularly, the data to be transmitted are first of all expressed, in conventional manner, in the form of "elementary symbols", that is to say complex numbers defined in accordance with a certain modulation method, for example of phase ("Phase Shift Keying" or "PSK"), or of both phase and amplitude in combination ("Quadrature Amplitude Modulation" or "QAM"). In an OFDM system, those elementary symbols are then taken P by P (where P is a predetermined integer) and converted, by means of an IDFT (Inverse Discrete Fourier Transform) into a series of K (where K is a predetermined integer) complex numbers $c_r$ (r=0, ..., K−1) representing as many "carriers". Finally, the real part of the signal is transmitted defined by:

$$c(t) \equiv \exp(-j\omega t) \sum_{r=0}^{K-1} c_r h(t - rT), \quad (1)$$

where the function h(t) is, by definition, equal to 1 in the interval 0≤t≤T. and zero outside that interval.

After receiving the modulated signal, a DFT (Discrete Fourier Transform) is implemented which is the inverse of the preceding one, which restores each of the individual elementary symbols.

For more details on OFDM, reference may for example be made to the book by R. van Nee and R. Prasad entitled "*OFDM for Wireless Multimedia Communications*" (Artech House, Boston and London, 2000).

Thus the noise affecting the signal c(t) during its transmission over the channel will globally affect the block of P elementary symbols from which it issues, and consequently the MP corresponding binary elements, where $2^M$ is the cardinal of the modulation constellation.

The present invention thus relates to a channel code adapted to take advantage of such a distribution of noise over a transmission channel. At the same time, it is desired for the code to be easy to decode, and to have a relatively high minimum distance.

Thus, according to a first aspect, the invention relates to a method of encoding information symbols, comprising a step in which a codeword v, of length n and orthogonal to a parity matrix H, is associated with every block of k information symbols belonging to a Galois field $F_q$, where q is an integer greater than 2 and equal to a power of a prime number. This method of encoding is remarkable in that the element $H_{\alpha\beta}$ at position (α, β) (where α=1, ..., n−k, and β=1, ..., n) of said parity matrix H is equal to the value taken by the monomial $M_\alpha$ at the point $P_\beta$, where the monomials $M_\alpha \equiv X^i Y^j$, where the integers i and j are positive or zero, are such that if, among those monomials, there is one at i>0 and arbitrary j, then there is also one at (i−1) and j, and if there is one at arbitrary i and j>0, then there is also one at i and (j−1), and said points $P_\beta$ are pairs of non-zero symbols of $F_q$ which have been classified by aggregates:

$(x_1,y_1(x_1)), (x_1,y_2(x_1)), \ldots, (x_1,y_{\lambda_1}(x_1)); (x_2,y_1(x_2)),$
$(x_2,y_2(x_2)), \ldots, (x_2,y_{\lambda_2}(x_2)); \ldots; (x_\mu,y_1(x_\mu)),$
$(x_\mu,y_2(x_\mu)), \ldots, (x_\mu,y_{\lambda_\mu}(x_\mu))$ $$\left(\text{with } \sum_{p=1}^{\mu} \lambda_p = n\right).$$

Thus, according to the invention, the columns of the parity matrix are arranged by "aggregates", an "aggregate" being defined as being a set of pairs of symbols belonging to $F_q$ which have a common value for the first element of those pairs. Each codeword $\underline{v}$ being, by definition, orthogonal to the parity matrix, it satisfies:

$$\sum_{\beta=1}^{n} H_{\alpha\beta} v_\beta = 0$$

(for $\alpha=1, \ldots, n-k$); it will thus be convenient, under the present invention, to replace the index $\beta$ by the corresponding point $P_\beta=(x,y)$ in order to identify a component of the codewords, such that it will be possible to write:

$$\underline{v}=[v(x_1,y_1(x_1)), \ldots v(x_1,y_{\lambda_1}(x_1)), \ldots, v(x_\mu,y_{\lambda_\mu}(x_\mu))];$$

furthermore, when components of codewords that are indexed in such manner by pairs (x,y) are such that their indexes have a common value x, it is convenient to state that those components form an "aggregate" of components. As the components belonging to the same aggregate are inserted in adjacent positions in the flow of data to transmit, the method of encoding according to the invention is particularly efficient for channels where the errors tend to occur in error bursts, provided that a method of correcting aggregates is implemented rather than of correcting individual errors. A method of correcting this type is moreover disclosed further on.

According to particular features applicable when said codewords $\underline{v}$ are destined to be transmitted in the form of blocks of predetermined length, successive codewords $\underline{v}$ are put end to end so as to form a continuous chain of data to transmit, and that chain of data is divided up into blocks of said predetermined length.

In this case, the components of an aggregate will, generally, be represented in the same data block transmitted; for example, in the case of OFDM, the components of each aggregate will be represented in the same interval of time KT.

According to still more particular features applicable when the codewords are not exactly divisible into blocks, each incomplete block is completed with a predetermined arbitrary sequence of data.

In a variant form, when the codewords are not exactly divisible into blocks, each incomplete block is completed by copying the value of the data situated at a predetermined number of positions of the corresponding codeword equal to the number of items of data to complete. It will usually be convenient to copy data situated in the same incomplete block.

Thanks to these provisions, it is possible to accelerate the process of transmitting blocks, and also to use the supplementary data so inserted for the purposes of synchronization.

According to particular features, on the one hand, said points $P_\beta$ form part of the solutions to an algebraic equation $$X^b + c Y^a + \Sigma c_{ij} X^i Y^j = 0,$$

where c ($\neq 0$) and the $c_{ij}$ are elements of $F_q$, a and b are strictly positive mutually prime integers, and where the sum only applies to the integers i and j which satisfy a i+b j<a b, and, on the other hand, the maximum power $j_{max}$ of Y in the monomials $M_\alpha$ is strictly less than a.

The benefit is thus obtained of the large minimum distance guaranteed by the algebraic geometric codes.

According to features that are still more particular, on the one hand, said monomials $M_\alpha = X^i Y^j$ satisfy:

$$a\, i + b\, j \leq m,$$

where m is a predetermined strictly positive integer, and on the other hand $$\lambda(x) \leq j_{max} + 1$$

for all $x = x_1, x_2, \ldots, x_\mu$.

As explained in detail further on, this particular structure of the parity matrix makes it possible to associate with each codeword a certain number of words encoded according to Reed-Solomon. The correction of errors for the latter words will advantageously be simple and rapid, as is well-known in relation to the algorithms adapted to Reed-Solomon codes.

In a complementary manner, according to the same first aspect, the invention relates to a method of decoding received data, remarkable in that said received data result from the transmission of encoded data according to any one of the methods of encoding described succinctly above.

The received data may in particular result from the transmission of data encoded in accordance with the method according to the invention provided with the still more particular features described above. In this case, a word $$\underline{r} = [r(x_1, y_1(x_1)), \ldots, r(x_1, y_{\lambda_1}(x_1)), \ldots, r(x_\mu, y_{\lambda_\mu}(x_\mu))],$$

of length n having been received, and an integer $s_{max}$ satisfying $$\lambda(x) - 1 \leq s_{max} \leq j_{max}$$

for all $x = x_1, x_2, \ldots, x_\mu$ having been predetermined, the decoding method, according to particular features, comprises the following steps:

for $s = 0, \ldots, s_{max}$:

calculating the word $$\underline{r}_s = [r_s(x_1), r_s(x_2), \ldots, r_s(x_\mu)],$$

of length $\mu$, in which, for $x = x_1, x_2, \ldots, x_\mu$, the symbol $$r_s(x) \equiv \sum_{i=1}^{\lambda(x)} [y_i(x)]^s r(x, y_i(x))$$

is erased if at least one of the symbols $r(x, y_i(x))$ is itself erased, and calculating the error syndrome vector as $\underline{\sigma}_s = H^{t(s)} \underline{r}_s^T$, where $$H^t \equiv \begin{bmatrix} 1 & 1 & \ldots & 1 \\ x_1 & x_2 & \ldots & x_\mu \\ \vdots & \vdots & \vdots & \vdots \\ x_1^{t-1} & x_2^{t-1} & \ldots & x_\mu^{t-1} \end{bmatrix},$$

and where t(s) designates the number of monomials $M_\alpha = X^i Y^j$ having j=s, attempting to calculate a word $\hat{\underline{v}}_0 \equiv [\hat{v}_0(x_1), \hat{v}_0(x_2), \ldots, \hat{v}_0(x_\mu)]$ by correcting the word $\underline{r}_0$ according to the error syndrome vector $\underline{\sigma}_0$ by means of an error correction algorithm adapted to take into account erasures, for s=1, ..., $s_{max}$ erasing, where the preceding error correction attempt has succeeded, for all x such that $\hat{v}_{s-1}(x) \neq r_{s-1}(x)$, the symbols $r_p(x)$ for p=s, ..., $s_{max}$, and attempting to calculate a word $\hat{\underline{v}} \equiv [\hat{v}_s(x_1), \hat{v}_s(x_2), \ldots, \hat{v}_s(x_\mu)]$ by correcting the word $\underline{r}_s$ according to the error syndrome vector $\underline{\sigma}_s$ by means of an error correction algorithm adapted to take into account erasures, and calculating, where the above ($s_{max}+1$) correction attempts have succeeded, for $x=x_1, x_2, \ldots, x_\mu$, the symbols $\hat{v}(x, y_i)$, where $i=1, \ldots, \lambda(x)$, which are respectively the estimated values of the transmitted symbols corresponding to the received symbols $r(x, y_i)$, by solving the system of ($s_{max}+1$) equations:

$$\hat{v}_s(x) \equiv \sum_{i=1}^{\lambda(x)} [y_i(x)]^s \hat{v}(x, y_i(x)),$$

for s=0, ..., $s_{max}$.

As can be seen, this decoding method explicitly manipulates the symbols received by aggregates. It is thus very sensitive to the number of aggregates of the received word which contain errors, and little sensitive to the total number of erroneous symbols in the received word. Due to this, the efficiency of the error correction is optimized, on condition that, for a received word comprising transmission errors, those errors only affect a limited number of aggregates, which is generally the case.

An additional advantage of this decoding method, by virtue of the flexibility given by the choice of the parameter $s_{max}$, is the possibility of U.E.P. (Unequal Error Protection) as explained in detail further on.

Moreover, it will be noted that it is easy to generalize the methods of encoding and decoding succinctly described above in the case in which the parity matrix H as described above is replaced by the parity matrix $H_A = H \cdot A$, where A is a non-singular diagonal matrix:

the word $\underline{r}^A \equiv \underline{r} \cdot A^{-1}$ is associated with each received word $\underline{r}$, to said word $\underline{r}^A$ a decoding method as succinctly described above is applied, for the code of which the parity matrix is H, and if that application results in an estimated value $\hat{\underline{v}}^A$, then $\hat{\underline{v}} = \hat{\underline{v}}^A \cdot A$ is taken as the estimated value of the transmitted word corresponding to said received word $\underline{r}$.

Similarly, it should be noted that the codewords $\underline{v}$ described above may be obtained, in entirely equivalent manner, by two steps instead of one, by commencing with a parity matrix $H^\pi$ obtained by applying an arbitrary permutation $\pi^{-1}$ to the columns of a matrix H as succinctly described above: first of all, on the basis of the information symbols, words $\underline{v}^\pi$ orthogonal to $H^\pi$ are constructed, then the permutation $\pi$ is applied to the components of $\underline{v}^\pi$, so as to obtain the words $\underline{v}$ destined to be transmitted, in which the components belonging to the same aggregate are adjacent. After receiving the word $\underline{r}$ corresponding to $\underline{v}$, and possible correction of the transmission errors so as to obtain an estimated value $\hat{\underline{v}}$, it suffices to apply the permutation $\pi^{-1}$ to that word $\hat{v}$ to obtain the estimated value $\hat{\underline{v}}^\pi$ of the word $\underline{v}^\pi$.

For the implementation of the invention, it is possible to choose a so-called "hyperelliptic" algebraic code, in which the exponent a of Y is equal to 2. However, from the article (in Japanese) by S. Miura entitled "Hyperelliptic Codes II" (12$^{th}$ Symposium on the Theory of Information and its Applications—SITA '89, Inuyama, Japan, December 1989), a decoding method is known which was designed for a family of codes also defined over a Galois field $F_q$. These codes will be referred to below as "Miura codes". These codes are of even length n and are characterized by a parity matrix cleverly chosen so that, to decode a received word, it is possible to apply any decoding algorithm for Reed-Solomon code of length n/2 to two words of length n/2 deduced in a certain manner from the received word.

A first family of Miura codes, of length n=2q, is defined by the following parity matrix (in what follows, a primitive element of the Galois field $F_q$ will be designated by $\gamma$):

$$H = \begin{pmatrix} \overline{H}^{2r} & \overline{H}^{2r} \\ \overline{H}^r Y_1 & \overline{H}^r Y_2 \end{pmatrix},$$

where
r is a strictly positive integer,
$\overline{H}^{2r}$ and $\overline{H}^r$ are respective embodiments for u=2r and u=r of the matrix $\overline{H}^u$ with u lines and q columns defined by $\overline{H}^u{}_{ij} = \gamma^{(i-1)(j-1)}$ ($1 \leq i \leq u$, $1 \leq j \leq q-1$), $\overline{H}^u{}_{Hd}{}^{iq} = 0$ ($2 \leq i \leq u$), and $\overline{H}^u{}_{1q} = 1$, and
$Y_1$ and $Y_2$ are two square matrices of dimension q, proportional to the identity matrix, and different from each other.

But the drawback of these Miura codes is that their minimum distance, which is equal to (2r+1), is (provided that r is greater than 8) less than the minimum distance of certain known algebraic geometric codes of the same redundancy (they are codes relying on an "attractive" hyperelliptic equation, i.e. having, whatever the value x of X, exactly two solutions $(x, y_1)$ and $(x, y_2)$ in $F_q$ and where, furthermore, these values $y_1$ and $y_2$ of Y are different from each other).

As explained in the work by R. E. Blahut cited above, it is simpler to decode a Reed-Solomon code of length (q-1) defined over $F_q$ than a code of length q, still defined over $F_q$. As the decoding of the codes used by the invention relies on decoding algorithms for Reed-Solomon codes, it is useful, to facilitate the decoding, to have codes shortened to the length n=2(q-1).

Furthermore, it is possible to define a second family of Miura codes, of length n=2(q-1), by the following parity matrix:

$$H = \begin{pmatrix} H^{2r} & H^{2r} \\ H^r Y_1 & H^r Y_2 \end{pmatrix},$$

where
r is a strictly positive integer,
$H^{2r}$-$H^r$ and $\gamma$ are respective embodiments for u=2r and u=r of the matrix $H^u$ with u lines and (q-1) columns defined by $H^U{}_{ij} = \gamma^{(i-1)(j-1)}$ ($1 \leq i \leq u$, $1 > j > q-1$), and
$Y_1$ and $Y_2$ are two square matrices of dimension (q-1), proportional to the identity matrix, and different from each other.

These Miura codes of the second family have the drawback, as for those of the first family, that their minimum distance, which is equal to (2r+1), is (provided that r is greater than 8) less than the minimum distance of known algebraic geometric codes of the same redundancy (which rely on an attractive hyperelliptic code).

By comparison, the code according to the invention, in the particular case in which, on the one hand, n=2q or n=2(q−1), and in which, on the other hand, n−k=3r for any strictly positive integer r, has similar properties of "decomposition" in a pair of Reed-Solomon codes as the Miura codes, but may have a greater minimum distance. It can be shown for example that the minimum distance of such a code according to the invention applied to an attractive hyperelliptic equation is equal to (2r+2); it is thus greater by one unit than the minimum distance of the corresponding Miura code. In a received word, a decoding algorithm adapted for such a code is capable of correcting r aggregates containing errors (of which the position and value are unknown before application of that algorithm), even if the two components of those aggregates are erroneous, except in the case in which certain aggregates are such that, not only the two components of such an aggregate contain an error, but these two errors are furthermore equal to each other.

According to the same first aspect, the invention also relates to a method of communication of data in the form of blocks of predetermined length. This communication method comprises the following steps:
  a) encoding the data to transmit, in accordance with one of the methods of encoding succinctly described above,
  b) transmitting said encoded data blocks by OFDM, and
  a) decoding the received data, in accordance with one of the methods of decoding succinctly described above, The advantages of this method of communication are essentially the same as those of the corresponding methods of encoding and decoding succinctly set out above, with, in addition, the particular advantages given by the OFDM.

According to a second aspect, the invention relates to various devices.

Thus the invention relates firstly to an encoding device comprising a unit for calculating codewords adapted to associate a codeword $\underline{v}$ of length n orthogonal to a parity matrix H with any block $\underline{k}$ of information symbols belonging to a Galois field $F_q$, where q is an integer greater than 2 and equal to a power of a prime number. This encoding device is remarkable in that the element $H_{\alpha\beta}$ at position $(\alpha, \beta)$ (where $\alpha=1,\ldots,n-k$, and $\beta=1,\ldots,n$) of said parity matrix H is equal to the value taken by the monomial $M_\alpha$ at the point $P_\beta$, where
  the monomials $M_\alpha \equiv X^i Y^j$, where the integers i and j are positive or zero, are such that if, among those monomials, there is one at i>0 and arbitrary j, then there is also one at (i−1) and j, and if there is one at arbitrary i and j>0, then there is also one at i and (j−1), and
  said points $P_\beta$ are pairs of non-zero symbols of $F_q$ which have been classified by aggregates:

$(x_1,y_1(x_1)), (x_1,y_2(x_1)),\ldots,(x_1,y_{\lambda_1}(x_1)); (x_2,y_1(x_2)),$
$(x_2,y_2(x_2)),\ldots,(x_2,y_{\lambda_2}(x_2));\ldots;(x_\mu,y_1(x_\mu)),$
$(x_\mu,y_2(x_\mu)),\ldots,(x_\mu,y_{\lambda_\mu}(x_\mu))$ $$\left( \text{with } \sum_{p=1}^{\mu} \lambda_p = n \right).$$

According to particular features, this encoding device further comprises a formatting unit adapted to put the successive words $\underline{v}$ end to end so as to form a continuous chain of data to transmit, and to divide up that chain of data into blocks of predetermined length.

According to still more particular features applicable when the codewords are not exactly divisible into blocks, said formatting unit is capable of completing each incomplete block with a predetermined arbitrary sequence of data.

According to still more particular features applicable when the codewords are not exactly divisible into blocks, said formatting unit is capable of completing each incomplete block by copying the value of the data situated at a predetermined number of positions of the corresponding codeword equal to the number of items of data to complete. For example these copied data may conveniently be situated in the same incomplete block.

Secondly, the invention relates to a device for decoding received data resulting from the transmission of data encoded according to any one of the encoding methods succinctly described above. This decoding device comprises:
  an error correction unit adapted to correct the transmission errors of said encoded data, and
  a unit for calculating information symbols.

Where the received data result from the transmission of data encoded in accordance with the method according to the invention provided with the still more particular features described above, a word $\underline{r} \equiv [r(x_1,y_1(x_1)),\ldots,r(x_1,y_{\lambda_1}(x_1)),\ldots,r(x_\mu,y_{\lambda_\mu}(x_\mu))],$ of length n having been received, and an integer $s_{max}$ satisfying $\lambda(x)-1 \leq s_{max} \leq j_{max}$ for all $x=x_1,x_2,\ldots,x_\mu$ having been predetermined, said error correction unit is, according to particular features, adapted to:

for $s=0,\ldots,s_{max}$:
  calculate the word $\underline{r}_s \equiv [r_s(x_1), r_s(x_2),\ldots,r_s(x_\mu)],$ of length μ, in which, for $x=x_1, x_2, \ldots, x_\mu$, each symbol $$r_s(x) \equiv \sum_{i=1}^{\lambda(x)} [y_i(x)]^s r(x, y_i(x))$$

is erased if at least one of the symbols $r(x,y_i(x))$ is itself erased, and
  calculate the error syndrome vector $\underline{\sigma}_s \equiv H^{t(s)} \underline{r}_s^T$, where $$H^t \equiv \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix},$$

and where t(s) designates the number of monomials $M_\alpha \equiv X^i Y^j$ having j=s,
  attempt to calculate a word $\underline{\hat{v}}_0 \equiv [\hat{v}_0(x_1), \hat{v}_0(x_2), \ldots, \hat{v}_0(x_\mu)]$ by correcting the word $\underline{r}_0$ according to the error syndrome vector $\underline{\sigma}_0$ by means for an error correction algorithm adapted to take into account erasures, for $s=1,\ldots,s_{max}$:

erase, where the preceding error correction attempt has succeeded, for all x such that $\hat{v}_{s-1}(x) \neq r_{s-1}(x)$, the symbols $r_p(x)$ for p=s, ..., $s_{max}$, and attempting to calculate a word $\underline{\hat{v}} \equiv [\hat{v}_s(x_1), \hat{v}_s(x_2), \ldots, \hat{v}_s(x_\mu)]$ by correcting the word $\underline{r}_s$ according to the error syndrome vector $\underline{\sigma}_s$ by means for an error correction algorithm adapted to take into account erasures, and calculate, where the above ($s_{max}$+1) correction attempts have succeeded, for x=$x_1, x_2, \ldots, x_\mu$, the symbols $\hat{v}(x, y_i)$, where i=1, ..., $\lambda(x)$, which are respectively the estimated values of the transmitted symbols corresponding to the received symbols $r(x, y_i)$, by solving the system of ($s_{max}$+1) equations:

$$\hat{v}_s(x) \equiv \sum_{i=1}^{\lambda(x)} [y_i(x)]^s \hat{v}(x, y_i(x)),$$

for s=0, ..., $s_{max}$.

According to particular features applicable when said codewords $\underline{v}$ have been transmitted in the form of blocks of predetermined length, the decoding device further comprises a reformatting device adapted to put said blocks of received data end to end after having removed, where appropriate, the data added before transmission to complete certain blocks, and to identify in the flow of data so obtained sequences of length n forming "received words" $\underline{r}$.

The advantages of these devices are essentially the same as those of the corresponding encoding and decoding methods described succinctly above.

The invention also relates to:

an apparatus for transmitting encoded digital signals, comprising an encoding device as succinctly described above, means for modulating said encoded digital signals, and a modulated data transmitter, an apparatus for recording encoded digital signals, comprising an encoding device as succinctly described above, means for modulating said encoded digital signals, and a modulated data recorder, an apparatus for receiving encoded digital signals, comprising a decoding device as succinctly described above, means for demodulating said encoded digital signals, and a modulated data receiver, an apparatus for reading encoded digital signals, comprising a decoding device as succinctly described above, means for demodulating said encoded digital signals, and a modulated data reader, a system for telecommunicating data in the form of blocks of predetermined length comprising at least one apparatus for transmitting encoded digital signals as succinctly described above, and at least one apparatus for receiving encoded digital signals as succinctly described above, a system for mass storage comprising at least one apparatus for recording digital signals as succinctly described above, at least one recording medium, and at least one apparatus for reading encoded digital signals as succinctly described above, a non-removable data storage means comprising computer program code instructions for the execution of the steps of any one of the methods of encoding and/or decoding and/or communicating succinctly described above, a partially or wholly removable data storage means comprising computer program code instructions for the execution of the steps of any one of the methods of encoding and/or decoding and/or communicating succinctly described above, and a computer program containing instructions such that, when said program controls a programmable data processing device, said instructions lead to said data processing device implementing one of the methods of encoding and/or of decoding and/or of communicating succinctly described above.

The advantages provided by these transmitting, recording, receiving or reading apparatuses, these systems for telecommunication or mass storage, these means for data storage and this computer program are essentially the same as those provided by the methods of encoding, decoding and communicating according to the invention.

Other aspects and advantages of the invention will emerge from a reading of the following detailed description of particular embodiments, given by way of non-limiting example. The description refers to the accompanying drawings, in which.

Figure 1:
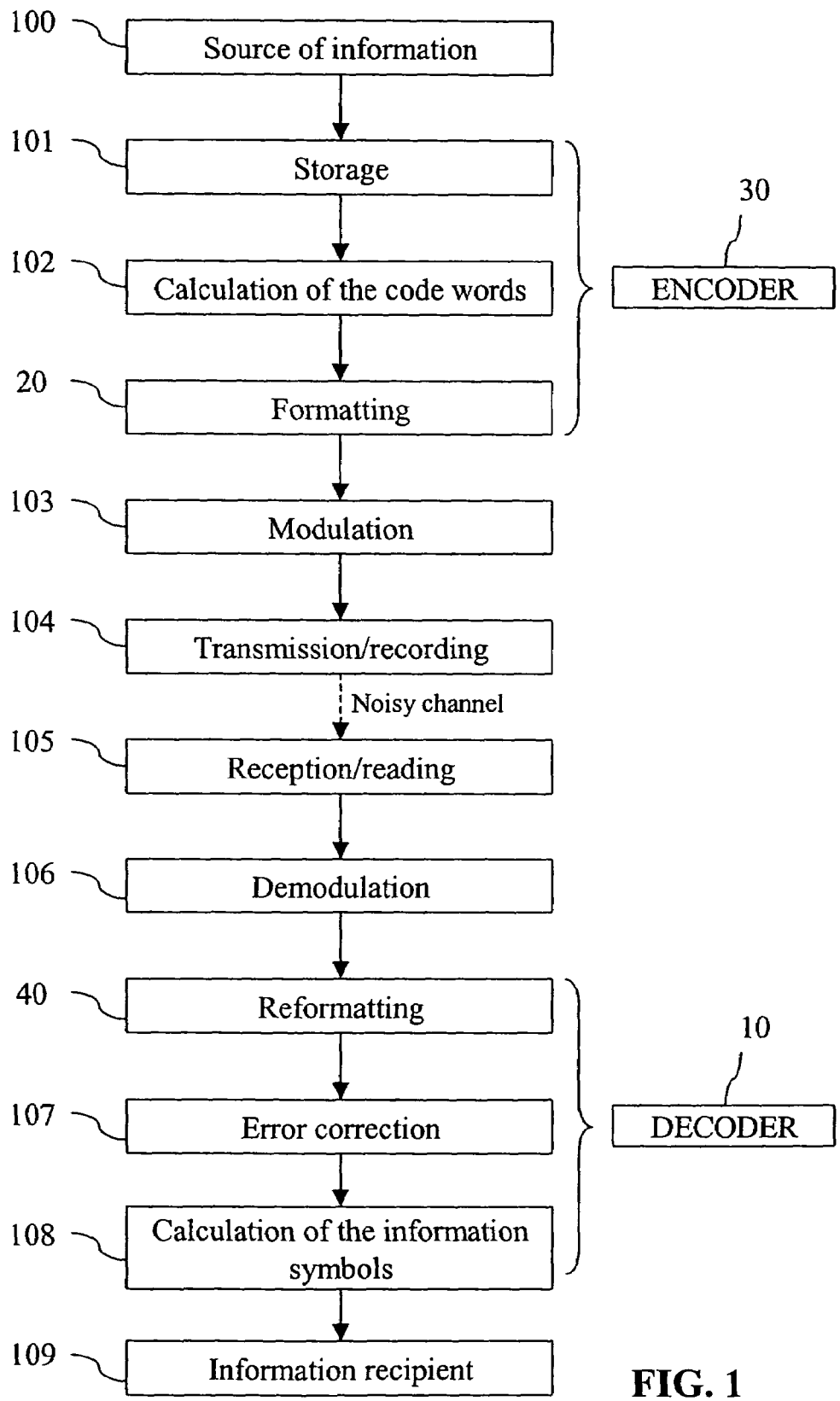
FIG. 1 is a block diagram of a system for transmitting information according to one embodiment of the invention.

The function of this system is to transmit information of any nature from a source 100 to a recipient or user 109. First of all, the source 100 puts this information into the form of symbols belonging to a certain alphabet (for example bytes of bits in the case in which the size q of the alphabet is 256), and transmits these symbols to a storage unit 101, which accumulates the symbols so as to form sets each containing k symbols. Next, each of these sets is transmitted by the storage unit 101 to a codeword computation unit 102 which constructs a word $\underline{v}$ orthogonal to the parity matrix H.

The methods of encoding and decoding according to the invention will now be illustrated, with the aid of a numerical example. Note that this example does not necessarily constitute a preferred choice of parameters for the encoding or decoding. It is provided here only to enable the person skilled in the art to understand the operation of the invention more easily.

An algebraic geometric code will thus be considered with length 1020 and dimension 918 defined as follows.

The alphabet of the symbols is constituted by the $2^8$ elements of the Galois field $F_{256}$ (i.e. by bytes of binary symbols) (this field may be constructed with the aid of the polynomial $(X^8+X^4+X^3+X^2+1)$ defined over $F_2$).

The following algebraic curve is then considered of genus g=24 of which the points (X y) are the solutions in $F_{256}$ of the equation with two unknowns $$f(X, Y) = X^{17} - Y^4 - Y = 0. \tag{1}$$

This equation is said to be "attractive" since, for any value x taken by X in $F_{256}$, the corresponding equation in Y has $\lambda(x)$=4 distinct solutions which are also in $F_{256}$. Each of the 256 sets of 4 points having a common value of X constitute an "aggregate" within the meaning of the invention.

This curve thus comprises 1024 points of finite coordinates (as well as a point P∞ at infinity). Preferably, the code will be "shortened" by removing from that set the four solutions of the equation for which x=0. The set of the remaining points $P_\beta$ (where β=1, ..., 1020) will thus constitute the locating set, each point $P_\beta$ serving to identify the $\beta^{th}$ element of any codeword. In accordance with the invention, by means of the number β, these points are classified such that the points of the same aggregate bear successive values of the number β (here four distinct values for each aggregate).

Next, the vector space L(mP∞) is considered of polynomials in X and Y with coefficients in $F_{256}$ of which solely the poles are situated in P∞, and are of order less than or equal to m, where m is a strictly positive integer (it is thus a so-called "one-point" algebraic geometric code). This vector space, which is of dimension greater than or equal to (m−g+1) (equal if m≧2g−2), has a base constituted by the monomials ($X^i Y^j$), where i is a positive integer or zero, j is an integer between 0 and 3, and: 4i+17j≦m. This quantity W(ij)≦4i+17j is often referred to as the "weight" of the monomial ($X^i Y^j$).

More generally, use could advantageously be made of an algebraic equation $$f(X,Y) \equiv X^b + c Y^a + \Sigma c_{ij} X^i Y^j = 0, \qquad (2)$$

where c (≠0) and the $c_{ij}$ are elements of $F_q$, a and b are strictly positive prime integers, and where the sum only applies to the integers i and j which satisfy ai+bj<ab.

For such an algebraic equation, only the monomials ($X^i Y^j$) where the exponent j of Y is strictly less than a, and the weight of such a monomial ($X^i Y^j$) is defined by W(ij)≡a i+b j. In this embodiment, a maximum weight m is set, such that the monomials may be classified in the sets of monomials $$T(j) \equiv \{X^i Y^j | 0 \leq i \leq (m-bj)/a\} \qquad (3)$$

for j≧0, j<a, and j<(m/b). The cardinal of this set T(j) is thus:

$$t(j) = 1 + INT[(m-bj)/a]$$

In the case of equation (1), where a=4 and b=17, if for example we take m=125, then 4 sets of monomials are obtained:

$T(0) \equiv \{X^i | 0 \leq i \leq 31\}$, with a maximum weight $W(31,0)$ =124, $T(1) \equiv \{X^i Y | 0 \leq i \leq 27\}$, with a maximum weight $W(27,1)$=125, $T(2) \equiv \{X^i Y^2 | 0 \leq i \leq 22\}$, with a maximum weight $W(22,2)$=122, and $T(3) \equiv \{X^i Y^3 | 0 \leq i \leq 18\}$, with a maximum weight $W(18,3)$=123.

The base of the vector space L(mP∞) then comprises: 32+28+23+19=102 monomials.

Finally, a parity matrix H is defined in the following manner: the monomials $M_\alpha = X^i Y^j$ (of weight less than or equal to m, and where the maximum value $j_{max}$ of j is strictly less than a) are arranged in any order as a function of i and j, and the element in line α (with α=1, . . . , n−k) and column β (with β=1, . . . , n) of the matrix H is equal to the monomial $M_\alpha$ evaluated at point $P_\beta$ of the algebraic curve. These points $P_\beta$ correspond to distinct solutions to the algebraic equation (2), but the person skilled in the art will decide, as a function of the application envisaged, if it is useful to include all the solutions in the locating set, or if on the contrary (as was done in the numerical example above) it is appropriate instead to select a particular solution. Whatever the case, each set of points $(x, y_p)$ (where p=1, . . . , λ(x)) of the locating set constitutes an aggregate within the meaning of the invention, and naturally λ(x)≦a.

It can thus be seen that the choice of the integers m and $$n - k = \sum_{j=0}^{j_{max}} t(j)$$

are related. Thus, in the numerical example considered:

n−k=102, and so k=918.

In this embodiment, it will moreover be required that the size chosen for each aggregate respects the condition $$\lambda(x) \leq j_{max} + 1 \ (x = x_1, x_2, \ldots, x_u),$$

in order to be able to implement the decoding method described further on.

The codeword calculation unit 102 constructs a word v, orthogonal to the parity matrix H so defined, on the basis of each set of k information symbols.

In this embodiment of the invention, the formatting unit 20 puts the words v end to end so as to construct blocks of the length provided for by the transmission system.

Units 101, 102 and 20 can be considered to form conjointly an "encoder" 30.

Encoder 30 transmits said blocks to a modulator 103. This modulator 103 associates a modulation symbol with each group of M binary symbols ("bits"). It may for example be a matter of a complex amplitude defined according to the 4-QAM constellation or 8-DPSK or 16-QAM; in fact it may be necessary, where appropriate, to limit (if permitted) the size of the constellation in order to limit the number of items of data included in each block of P elementary symbols (where, for example, P=96), since a transmission error affecting a whole block representing a high number of components of v could prove to exceed the correction capacity for the code.

However, it is then necessary to know how to solve the practical problem which arises when the codewords are not exactly divisible into blocks, i.e. when the length of the codewords, expressed in bits, is not an integer multiple of the MP bits represented in a block.

To illustrate this problem, consider again our example in which the codewords have a length of 1020 bytes (corresponding to q=256), i.e. 8160 bits, and take P=96. We find that 8160 is not divisible by 96M, whether M be equal to 2, to 3 or to 4. Take, for example, M=2: the bits of a codeword will then "fill" 42 blocks each representing 192 bits, but 96 bits will still remain to be processed, which only occupy half a block.

Consider first of all the case in which the components of the codewords are not continuously produced by the encoder 30. If a first block has been commenced at the same time as a codeword, then the last block is half incomplete, since the second half of its contents, which could "accommodate" the start of the following codeword, is not yet available. This causes a delay in the transmission which may be bothersome for the recipient of the transmission.

To overcome this problem, in this embodiment, the last block is completed by some predetermined sequence, for example a series of zeros. In a variant form, 96 bits read from predetermined positions of the codeword are repeated, for example the last 96 bits of the codeword represented in the first half of the last block. Next the block completed in this way is transmitted without awaiting the following codeword.

These two ways of associating codewords, and blocks to be transmitted, can also be used in the case in which the components of the codewords are continuously produced by the encoder 30. This is because one or other of these ways may conveniently be used by the receiver of the transmission for the purposes of synchronization, since it suffices the receiver to detect a data block of which the second half contains, in the first embodiment, a predetermined sequence, or else, in the second embodiment, a repetition of data already received in certain predetermined positions.

Next, these modulation symbols are transmitted to a transmitter or to a recorder 104, which inserts the symbols in a transmission channel. This channel may for example be a wired transmission or wireless transmission as is the case with a radio link. It may also correspond to storage on a suitable carrier such as a DVD or magnetic tape.

As explained above, there may advantageously be an OFDM transmitter transmitting a superposition of K (where, for example, K=48, or 64, or 96) discrete Fourier transformations of the P elementary symbols.

This transmission, after having been affected by a "transmission noise" whose effect is to modify or erase certain of the transmitted data at random, arrives at a receiver or a reader 105. It may advantageously be an OFDM receiver which applies a discrete Fourier transformation, inverse to the previous one, to the complex amplitude received, so as to obtain P elementary symbols.

The receiver (or reader) 105 then transmits these elementary symbols to the demodulator 106, which transforms them into symbols of the alphabet $F_q$. These symbols of $F_q$ are then transmitted to the reformatting unit 40.

The reformatting unit 40 commences by erasing the additional data from each successive block, for example series of zeros, which had been added to the data blocks to "complete" those blocks, before transmitting them. Next, it identifies sequences of n successive symbols so obtained, each of these sequences constituting a "received word".

That word r is next processed by a unit 107, which implements an error correcting algorithm, so as to provide an "associated codeword".

Before presenting such an algorithm, it is useful to briefly reconsider the encoding according to the embodiment, described above, which utilizes an algebraic equation (2).

A formulation for belonging to the code will be presented which is equivalent to the orthogonal relationship $H \cdot \underline{v}^T = 0$, and which will be very convenient for the decoding of the received words.

For every codeword $$\underline{v} = [v(x_1, y_1(x_1)), \ldots, v(x_1, y_{\lambda_1}(x_1)), \ldots, v(x_\mu, y_{\lambda_\mu}(x_\mu))],$$

for each aggregate attached to one of the values $x_1, x_2, \ldots, x_\mu$ of x, there are constructed ($j_{max}+1$) "s-aggregate symbols"

$$v_s(x) \equiv \sum_{i=1}^{\lambda(x)} [y_i(x)]^s v(x, y_i(x))$$

for $s=0, \ldots, j_{max}$ (it should be recalled that $j_{max}$ is the maximum exponent of Y among the monomials $M_\alpha$).

There are then constructed ($j_{max}+1$) "s-aggregate words"

$$\underline{v}_s = [v_s(x_1), v_s(x_2), \ldots, v_s(x_\mu)],$$

of length $\mu$, with the use of which the condition of belonging to the code is reduced to the set of ($j_{max}+1$) equations:

$$H^{t(s)} \cdot \underline{v}_s^T = 0,$$

where, by definition, $$H^t \equiv \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix}. \qquad (4)$$

The advantage of this formulation is that the matrix $H^t$ of equation (4) is a Vandermonde matrix defined over $F_q$; consequently, if $H^{t(s)}$ is considered as a parity matrix defining codewords $\underline{v}_s$, we have here, for each value of s, a Reed-Solomon code, for which decoding algorithms are known which are simple as well as providing good performance; for example the Berlekamp-Massey algorithm could be used for locating erroneous symbols, followed by the Forney algorithm for the correction of those erroneous symbols.

More specifically, according to one embodiment of the invention, it is possible to proceed as follows to correct a received word $$\underline{r} = [r(x_1, y_1(x_1)), \ldots, r(x_1, y_{\lambda_1}(x_1)), \ldots, r(x_\mu, y_{\lambda_\mu}(x_\mu))]$$

(of length n) taking into account erasures, i.e. information according to which the value of the symbol in a particular position in the received word is uncertain.

It is assumed that an integer $s_{max}$ satisfying $$\lambda(x) - 1 \leq s_{max} \leq j_{max}$$

for all $x = x_1, x_2, \ldots, x_\mu$, whose utility will appear further on, had been chosen before carrying out the following steps. By default, it is always possible to take $s_{max} = j_{max}$ Firstly, for $s=0, \ldots, s_{max}$:
calculation is made of the word $$\underline{r}_s = [r_s(x_1), r_s(x_2), \ldots, r_s(x_\mu)],$$

of length $\mu$, in which, for $x = x_1, x_2, \ldots, x_\mu$, each symbol $$r_s(x) \equiv \sum_{i=1}^{\lambda(x)} [y_i(x)]^s r(x, y_i(x))$$

is erased if at least one of the symbols $r(x, y_i(x))$ is considered as doubtful by the receiver, and
calculation is made of the error syndrome vector $\underline{\sigma}_s = H^{t(s)} \underline{r}_s^T$, where $$H^t \equiv \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix},$$

and where t(s) designates the number of monomials $M_\alpha = X^i Y^j$ having $j=s$.

Next, an attempt is made to calculate a word $\hat{\underline{v}}_0 = [\hat{v}_0(x_1), \hat{v}_0(x_2), \ldots, \hat{v}_0(x_\mu)]$ by correcting the word $\underline{r}_0$ according to the error syndrome vector $\underline{\sigma}_0$ by means for an error correction algorithm adapted to take into account erasures, such as the combination of the Berlekamp-Massey and Forney algorithms.

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If, on the other hand, the correction algorithm is capable of proposing a word $\hat{v}_0$, then for all x such that $\hat{v}_0(x) \neq r_0(x)$, the symbols $r_p(x)$ are erased for $p=1, \ldots, s_{max}$.

Next, an attempt is made to calculate a word $\underline{\hat{v}}_1 \equiv [\hat{v}_1(x_1), \hat{v}_1(x_2), \ldots, \hat{v}_1(x_\mu)]$ by correcting the word $\underline{r}_1$ according to the error syndrome vector $\underline{\sigma}_1$ by means for an error correction algorithm adapted to take into account erasures, such as the combination of the Berlekamp-Massey and Forney algorithms.

If that algorithm has not been able to provide a corrected word, it is thereby concluded that the means implemented do not enable that received word to be corrected, due to too high a number of transmission errors; the operations following (for example, replacing the word with a predetermined word such as the zero word) depend on the applications envisaged for the decoding method.

If, on the other hand, the correction algorithm is capable of proposing a word $\hat{v}_1$, for all x such that $\hat{v}_1(x) \neq r_1(x)$, the symbols $r_p(x)$ are erased for $p=2, \ldots s_{max}$.

The correction of the words $\underline{r}_s$ is continued in similar manner (if possible) up to $s=s_{max}$.

Finally, where the above $(s_{max}+1)$ correction attempts have succeeded, calculation is made, for $x=x_1, x_2, \ldots, x_\mu$, the symbols $\hat{v}(x, y_i)$, where $i=1, \ldots, \lambda(x)$, which are respectively the estimated values of the transmitted symbols corresponding to the received symbols $r(x, y_i)$, by solving the system of $(s_{max}+1)$ equations:

$$\hat{v}_s(x) \equiv \sum_{i=1}^{\lambda(x)} [y_i(x)]^s \hat{v}(x, y_i(x)) \quad (5)$$

for $s=0, \ldots, s_{max}$.

For a given x, is it always possible to solve this system of equations? Note first of all that this system has the matrix $$\begin{bmatrix} 1 & 1 & \cdots & 1 \\ y_1 & y_2 & \cdots & y_\lambda \\ \vdots & \vdots & \vdots & \vdots \\ y_1^{s_{max}} & y_2^{s_{max}} & \cdots & y_\lambda^{s_{max}} \end{bmatrix}, \quad (6)$$

where the symbols $y_1, y_2, \ldots, y_\lambda$ refer to the aggregate considered and are all distinct taken in pairs: it is thus a Vandermonde matrix. Moreover, as indicated above, $\lambda(x)-1 \leq s_{max} \leq j_{max} < a$.

If $\lambda(x) = s_{max}+1$, matrix (6) is square, and the inversion of system (5) produces one and only one solution.

If, on the other hand, $\lambda(x) \leq s_{max}$, system (5) is "over determined". In this case, it is possible for example to use the $\lambda(x)$ first equations of system (5) to calculate the $\hat{v}(x, y_i)$ symbols, and to use the $(s_{max}+1-\lambda(x))$ remaining equations, when one or more of them is not satisfied, to detect wrongly estimated values for the s-aggregate symbols $\hat{v}_s(x)$. It can thus be seen that, in the context of the decoding algorithm according to the invention, the correction of the symbols belonging to small aggregates may be rendered more reliable than that of the symbols belonging to large aggregates. Consequently, the method of decoding according to the invention gives the possibility of "unequal protection" against errors, which is desirable in certain applications as is well known to the person skilled in the art.

Once the correction has been terminated, the associated codeword $\underline{\hat{v}}$ is transmitted to an information symbols calculation unit 108, which extracts from it k information symbols by performing the inverse of the transformation implemented by unit 102. Finally, these information symbols are supplied to their recipient 109.

Units 40, 107 and 108 can be considered to form conjointly a "decoder" 10.

Figure 2:
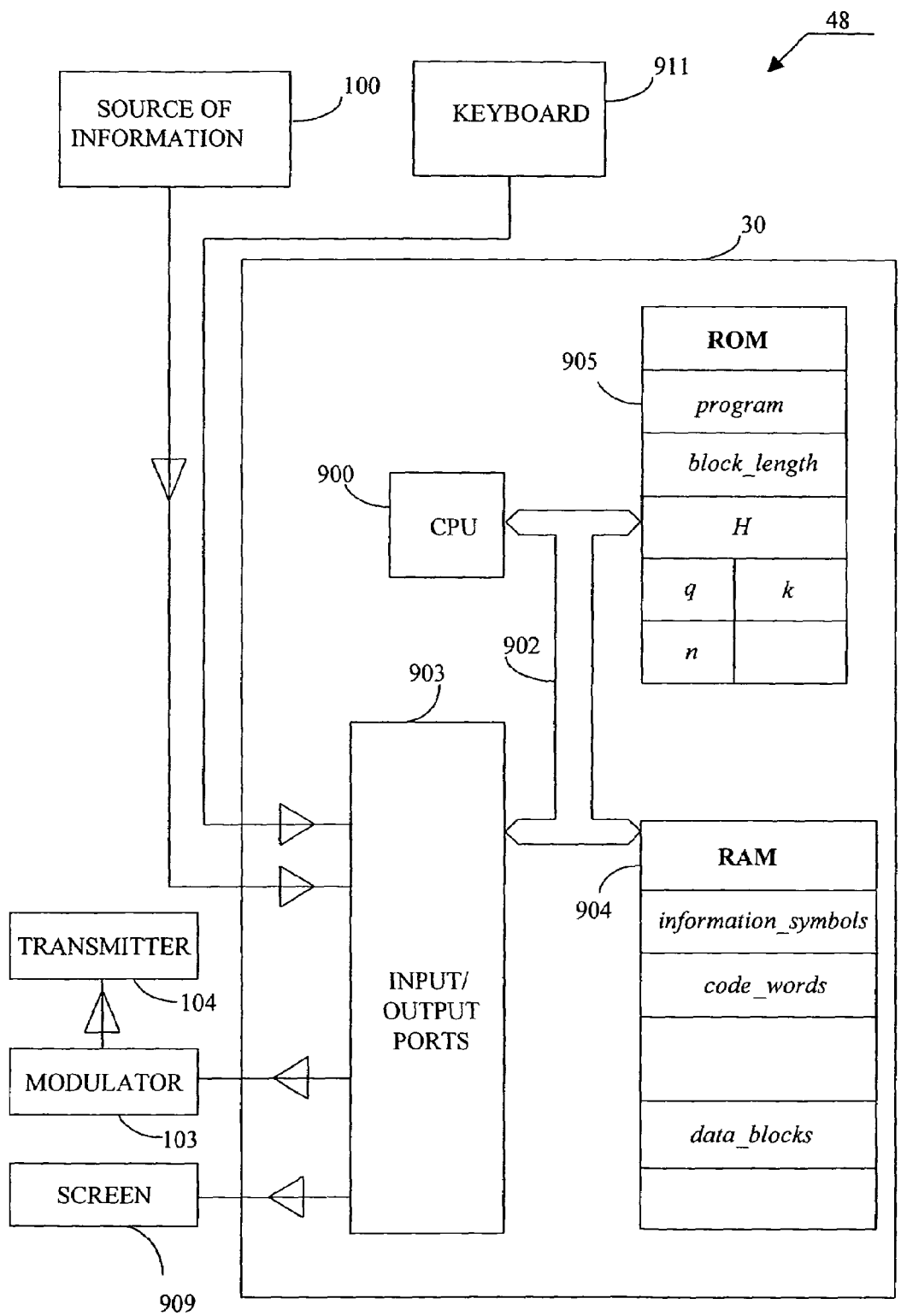
FIG. 2 represents an apparatus for transmitting signals incorporating an encoder according to the invention.

The block diagram of FIG. 2 represents, very schematically, a device 48 for transmitting signals incorporating an encoder 30.

This device 48 comprises a keyboard 911, a screen 909, a source of external information 100, a modulator 103 and a transmitter of modulated data 104, conjointly connected to input/output ports 903 of an encoder 30 which is implemented here in the form of a logic unit.

The encoder 30 comprises, connected together by an address and data bus 902:

a central processing unit 900,
a random access memory RAM 904,
a read only memory 905, and
said input/output ports 903.

Each of the elements illustrated in FIG. 2 is well known to a person skilled in the art of microcomputers and transmission systems and, more generally, of information processing systems. These known elements are therefore not described here. It should be noted, however, that:

the information source 100 could, for example, be an interface peripheral, a sensor, a demodulator, an external memory or other information processing system (not shown), and could for example supply sequences of signals representing speech, service messages or multimedia data in particular of the IP or ATM type, in the form of sequences of binary data, and the transmitter 104 is adapted to transmit signals of the OFDM system.

The random access memory 904 stores data, variables and intermediate processing results, in memory registers bearing, in the description, the same names as the data whose values they store. It should be noted, in passing, that the word "register" designates, throughout the present description, a memory area of low capacity (a few items of binary data) and equally a memory area of large capacity (making it possible to store a complete program) within a random access memory or read only memory.

The random access memory 904 contains in particular the following registers:

a register "information_symbols" in which the information symbols belonging to $F_q$ are stored, a register "code_words", in which are stored the codewords $\underline{v}$, and a register "data_blocks" in which are stored the data blocks before they are submitted to the modulator 103.

The read only memory 905 is adapted to store, in registers which, for convenience, have the same names as the data which they store:

the operating program of the central processing unit 900, in a register "program", the cardinal of the Galois field $F_q$ serving as alphabet for the code used, in a register "q", the number of information symbols serving to construct a codeword, in a register "k", the length of the stored codewords, in a register "n", the parity matrix of the code, in a register "H", and the length of the data blocks transmitted, in a register "block_length".

Figure 3:
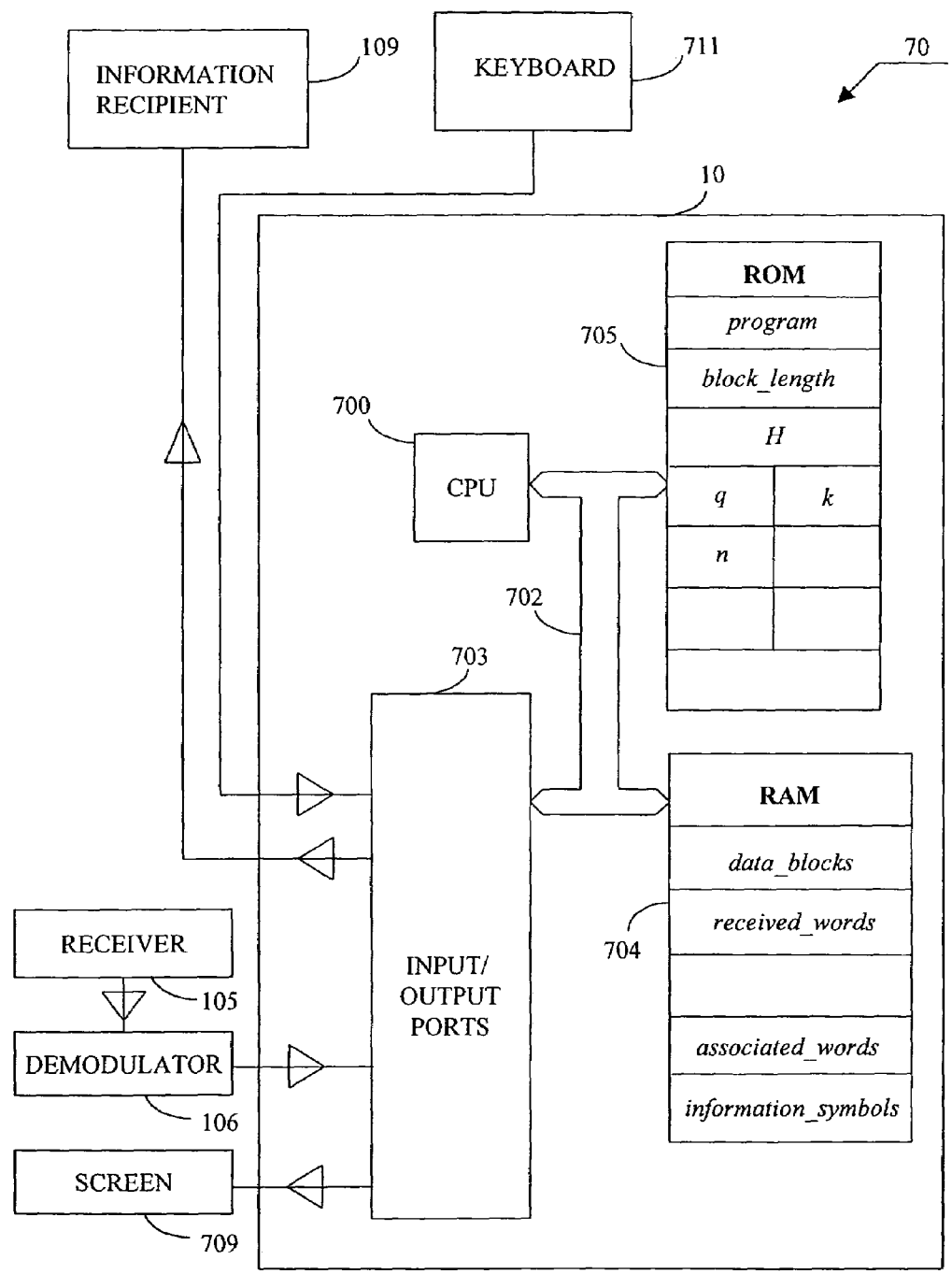
FIG. 3 represents an apparatus for receiving signals incorporating a decoder according to the invention.

The block diagram of FIG. 3 represents, very schematically, a signal receiving device 70 incorporating the decoder 10.

This apparatus 70 comprises a keyboard 711, a screen 709, a recipient of external information 109, a modulated data receiver 105 and a demodulator 106, conjointly connected to input/output ports 703 of the decoder 10 which is produced here in the form of a logic unit.

The decoder 10 comprises, connected together by an address and data bus 702:

a central processing unit 700, a random access memory (RAM) 704, read only memory (ROM) 705; and said input/output ports 703.

Each of the elements illustrated in FIG. 3 is well known to a person skilled in the art of microcomputers and transmission systems and, more generally, of information processing systems. These known elements are therefore not described here. It should be noted, however, that:

the information recipient 109 could, for example, be an interface peripheral, a display, a modulator, an external memory or other information processing system (not shown), and could be adapted to receive sequences of signals representing speech, service messages or multimedia data in particular of the IP or ATM type, in the form of sequences of binary data, and the receiver 105 is adapted to receive signals of the OFDM system.

The random access memory 704 stores data, variables and intermediate processing results, in memory registers bearing, in the description, the same names as the data whose values they store. The random access memory 704 contains in particular the following registers:

a register "data_blocks" in which the data blocks issuing from the demodulator 106 are stored, a register "received_words", in which the received words $\underline{r}$ are stored, a register "associated_words" in which, the case arising, the words $\hat{\underline{v}}$ resulting from the correction of $\underline{r}$ are stored, and a register "information_symbols" in which the information symbols calculated by the unit 108 are stored.

The read only memory 705 is adapted to store, in registers which, for convenience, have the same names as the data which they store:

the operating program of the central processing unit 700, in a register "program", the length of the data blocks transmitted, in a register "block_length", the cardinal of the Galois field $F_q$ serving as alphabet for the code used, in a register "q", the length of the stored codewords, in a register "n", the number of information symbols serving to construct a codeword, in a register "k", and the length of the parity matrix of the code, in a register "H".

It should be noted that, in certain applications, it will be convenient to use the same computer device (functioning in multitask mode) for the exchange, that is to say both the transmission and reception, of signals according to the invention; in this case, the units 10 and 30 will be physically identical.

To finish with, it should be noted that, when the code relies on a algebraic equation (2) and when the channel considered produces both error bursts and independent errors in relation to the symbols (and not in relation to the aggregates), it is advisable to use two decoders in parallel: the first will use the decoding algorithm according to the invention, and the second will use any known algorithm appropriate to correct, for an algebraic geometric code, the errors and/or erasures of symbols individually (for example the algorithm known as that of "Feng and Rao"). If a single of these two algorithms is capable of providing an estimated value of the transmitted word, or if both algorithms provide the same estimated value, it will be natural to accept that estimated value; on the other hand, it those algorithms provide two different estimated values, it will be necessary to provide a method of arbitration taking into account, preferably, the characteristics of the channel considered.

It will also be noted that, even if an application of the invention to the transmission of data over a radio channel has been described above by way of example, the methods according to the invention may equally be applied to mass storage, for example within the same computer; in that case, for example, unit 104 may be a recorder and unit 105 a reader of data on magnetic or magnetic-optic disk. Such an application is all the more appropriate since certain recording media of that type are subject to error bursts.

The invention claimed is:

1. A method of encoding information symbols, comprising a step of:

encoding the information symbols by calculating codewords, wherein each codeword $\underline{v}$ has a length n, being orthogonal to a parity matrix H and being associated with every block of k information symbols belonging to a Galois field $F_q$, wherein q is an integer greater than 2 and equal to a power of a prime number, wherein element $H_{\alpha\beta}$ at position $(\alpha,\beta)$ of said parity matrix H, with $\alpha$ varying from 1 to n-k and $\beta$ varying from 1 to n, is equal to the value taken by the monomial $M_\alpha$ at the point $P_\beta$, and wherein the monomials $M_\alpha \equiv X^i Y^j$, where the integers i and j are positive or zero, are such that if, among those monomials, there is one at i>0 and arbitrary j, then there is also one at (i-1) and j, and if there is one at arbitrary i and j>0, then there is also one at i and (j-1), and said points $P_\beta$ are pairs of non-zero symbols of $F_q$ which have been classified by aggregates as follows when $\beta$ varies from 1 to n:

$(x_1, y_1(x_1)), (x_1, y_2(x_1)), \ldots, (x_1, y_{\lambda_1}(x_1)); (x_2, y_1(x_2)), (x_2, y_2(x_2)), \ldots, (x_2, y_{\lambda_2}(x_2)); \ldots ; (x_\mu, y_1(x_\mu)), (x_\mu, y_2(x_\mu)), \ldots, (x_\mu, y_{\lambda_\mu}(x_\mu)),$ where $\mu$ denotes the number of aggregates and, for any i between 1 and $\mu$, $\lambda_i$ denotes the number of pairs with $x_i$ as a first element.

2. An encoding method according to claim 1, wherein successive codewords $\underline{v}$ are put end to end so as to form a continuous chain of data to transmit, and the chain of data is divided up into blocks of a predetermined length.

3. An encoding method according to claim 2, in which the codewords are not exactly divisible into blocks, and each incomplete block is completed with a predetermined arbitrary sequence of data.

4. An encoding method according claim 2, in which the codewords are not exactly divisible into blocks, and each incomplete block is completed by copying the value of the data situated at a predetermined number of positions of the corresponding codeword equal to the number of items of data to complete.

5. A method of encoding according to claim 4, in which the copied data is situated in the same incomplete block.

6. An encoding method according to any one of the preceding claims, in which the points $P_\beta$ form part of the solutions to an algebraic equation $$X^b + cY^a + \Sigma c_{ij} X^i Y^j = 0$$

where c is non-null and the $c_{ij}$ values are elements of $F_q$, $\alpha$ and b are strictly positive mutually prime integers, and where the sum only applies to the integers i and j which satisfy $\alpha i + bj < \alpha b$, and the maximum power $j_{max}$ of Y in the monomials $M_\alpha$ is strictly less than $\alpha$.

7. An encoding method according to claim 6, in which the monomials $M_\alpha = X^i Y^j$ satisfy:

$$\alpha i + bj \leq m,$$

where m is a predetermined strictly positive integer, and $$\lambda(x) \leq j_{max} 1$$

for all $x = x_1, x_2, \ldots, x_\mu$.

8. A method of decoding received data resulting from a transmission of data encoded according to claim 7, comprising the steps of:

receiving a word $$\underline{r} = [r(x_1, y_1(x_1)), \ldots, r(x_1, y_{\lambda_1}(x_1)), \ldots, r(x_\mu, y_{\lambda_\mu}(x_\mu))],$$

of length n;
determining an integer $s_{max}$ satisfying $$\lambda(x) - 1 \leq s_{max} \leq j_{max}$$

for all $x = x_1, x_2, \ldots, x_\mu$;
calculating, for $s = 0, \ldots, s_{max}$ the word $$\underline{r}_s = [r_s(x_1), r_s(x_2), \ldots, r_s(x_\pi)],$$

of length $\mu$, in which, for $x = x_1, x_2, \ldots, x_\mu$, a symbol $$r_s(x) \equiv \sum_{i=1}^{\lambda(x)} [y_i(x)]^s r(x, y_i(x))$$

is erased if at least one of the symbols $r(x, y_i(x))$ is itself erased;
calculating an error syndrome vector $\sigma_s \equiv H^{t(s)} \underline{r}_s^T$, where $$H^t \equiv \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix},$$

and where t(s) designates a number of monomials $M_\alpha = x^i Y^j$ having $j = s$;
attempting to calculate a word $\hat{\underline{v}}_0 = [\hat{v}_0(x_1), \hat{v}(x_2), \ldots, \hat{v}_0(x_{82})]$ by correcting the word $\underline{r}_0$ according to the error syndrome vector $\sigma_0$ by means of an error correction algorithm adapted to take into account erasures;
erasing, for $s = 1, \ldots, s_{max}$, where the preceding error correction attempt has succeeded, for all x such that $\hat{v}_{s-1}(x) \neq r_{s-1}(x)$, the symbols $r_p(x)$ for $p = s, \ldots, s_{max}$;
attempting to calculate a word $\hat{\underline{v}}_s = [\hat{v}_s(x_1), \hat{v}_s(x_2), \ldots, \hat{v}_s(x_\mu)]$ by correcting the word $\underline{r}_s$ according to the error syndrome vector $\sigma_s$ by means of an error correction algorithm adapted to take into account erasures;

calculating, where the correction attempts have succeeded, for $x = x_1, x_2, \ldots, x_\mu$, the symbols $\hat{v}(x, y_i)$, where $i = 1, \ldots, \lambda(x)$, which are respectively the estimated values of the transmitted symbols corresponding to the received symbols $r(x, y_i)$, by solving the system of $(s_{max} + 1)$ equations:

$$\hat{v}_s(x) \equiv \sum_{i=1}^{\lambda(x)} [y_i(x)]^s \hat{v}(x, y_i(x)), \text{ for } s = 0, \ldots, s_{max}.$$

9. A device for decoding received data resulting from a transmission of data encoded according to claim 7, comprising an error correction unit adapted to:

receive a word $$\underline{r} = [r(x_1, y_1(x_1)), \ldots, r(x_1, y_{\lambda_1}(x_1)), \ldots, r(x_\mu, y_{\lambda_\mu}(x_\mu))],$$

of length n;

$$\lambda(x) - 1 \leq s_{max} \leq j_{max}$$

for all $x = x_1, x_2, \ldots, x_\mu$; to:
calculate, for $s = 0, \ldots$ the word $$\underline{r}_s = [r_s(x_1), r_s(x_2), \ldots, r_s(x_\mu)],$$

of length $\mu$, in which, for $x = x_1, x_2, \ldots, x_\mu$, each symbol $$r_s(x) \equiv \sum_{i=1}^{\lambda(x)} [y_i(x)]^s r(x, y_i(x))$$

is erased if at least one of the symbols $r(x, y_i(x))$ is itself erased;
calculate the error syndrome vector $\sigma_s = H^{t(s)} \underline{r}_s^T$, where $$H^t \equiv \begin{bmatrix} 1 & 1 & \cdots & 1 \\ x_1 & x_2 & \cdots & x_\mu \\ \vdots & \vdots & \vdots & \vdots \\ x_1^{t-1} & x_2^{t-1} & \cdots & x_\mu^{t-1} \end{bmatrix},$$

and where t(s) designates the number of monomials $M^\alpha = X^i Y^j$ having $j = s$;
attempt to calculate a word $\hat{\underline{v}}_0 = [\hat{v}_0(x_1), \hat{v}_0(x_2), \ldots, \hat{v}_0(x_\mu)]$ by correcting the word $\underline{r}_0$ according to the error syndrome vector $\sigma_0$ by means of an error correction algorithm adapted to take into account erasures;
erase, for $s = 1, \ldots, s_{max}$, where the preceding error correction attempt has succeeded, for all x such that $\hat{v}_{s-1}(x) \neq r_{s-1}(x)$, the symbols $r_p(x)$ for $p = s, \ldots, s_{max}$;
attempt to calculate a word $\hat{\underline{v}} = [\hat{v}_s(x_1), \hat{v}_s(x_2), \ldots, \hat{v}_s(x_\mu)]$ by correcting the word $\underline{r}_s$ according to the error syndrome vector $\sigma_s$ by means of an error correction algorithm adapted to take into account erasures; and
calculate where the correction attempts have succeeded, for $x = x_1, x_2, \ldots, x_\mu$, the symbols $\hat{v}(x, y_i)$, where $i = 1, \ldots, \lambda(x)$, which are respectively the estimated values of the transmitted symbols corresponding to the received symbols $r(x, y_i)$, by solving the system of $(s_{max} + 1)$ equations:

$$\hat{v}_s(x) \equiv \sum_{i=1}^{\lambda(x)} [y_i(x)]^s \hat{v}(x, y_i(x)), \text{ for } s = 0, \ldots, s_{\max}.$$

10. An encoding method in which a parity matrix of code is obtained by post-multiplying a parity matrix according to any one of claims 1-5 by a non-singular diagonal matrix.

11. A method of encoding information symbols, comprising a step of calculating codewords in which a codeword $\underline{v}^\pi$, of length n and orthogonal to a parity matrix $H^\pi$ is associated with every block of k information symbols belonging to a Galois field $F_q$, where q is an integer greater than 2 and equal to a power of a prime number, and a step in which a predetermined permutation $\pi$ is applied to the components of $\underline{v}^\pi$ so as to obtain words $\underline{v}$ adapted to be transmitted, wherein said parity matrix $H^\pi$ is obtained by applying the permutation $\pi^{-1}$ to the columns of a parity matrix according to any one of claims 1-5.

12. A method of decoding received data, the method comrising: decoding the data encoded according to any one of claims 1-5.

13. A fixed data storage device, comprising program code instructions executable by a computer for performing the steps of a decoding method according to claim 12.

14. A partially or totally removable data storage device, comprising computer program code instructions executable by a computer for performing the steps of a decoding method according to claim 12.

15. A computer program product, containing instructions such that, when said program controls a programmable data processing device, said instructions cause said data processing device to implement a decoding method according to claim 12.

16. A device for decoding received data resulting from a transmission of data encoded according to any one of claims 1 to 5, comprising:
   an error correction unit adapted to correct transmission errors of the encoded data, and
   a unit for calculating information symbols.

17. A decoding device according to claim 16 or in which said codewords $\underline{v}$ have been transmitted in the form of blocks of predetermined length, further comprising a reformatting device adapted to put said blocks of received data end to end after having removed, where appropriate, the data added before transmission to complete certain blocks, and to identify in the flow of data so obtained sequences of length n forming received words $\underline{r}$.

18. Apparatus for receiving encoded digital signals, comprising a decoding device according to claim 16, means for demodulating the encoded digital signals, and a modulated data receiver.

19. Apparatus according to claim 18, in which the demodulation is in accordance with OFDM.

20. Apparatus for reading encoded digital signals, comprising a decoding device according to claim 16, means for demodulating the encoded digital signals, and a modulated data reader.

21. A method of communicating data in the form of blocks of predetermined length, comprising the steps of:
   encoding the data to transmit, in accordance with the method of encoding according to any one of claims 1-5;
   transmitting the encoded data blocks by OFDM; and
   decoding the received data.

22. A device for encoding information symbols comprising:
   an encoder configured to encode the information symbols by calculating codewords,
      wherein each codeword $\underline{v}$ has a length n, being orthogonal to a parity matrix H and being associated with every block of k information symbols belonging to a Galois field $F_q$,
      wherein q is an integer greater than 2 and equal to a power of a prime number,
      wherein element $H_{\alpha\beta}$ at position $(\alpha,\beta)$ of the parity matrix H, with $\alpha$ varying from 1 to n-k and $\beta$ varying from 1 to n, is equal to the value taken by monomial $M_\alpha$ at a point $P_\beta$, and
      wherein the monomials $M_\alpha \equiv X^i Y^j$, where the integers i and j are positive or zero, are such that if, among those monomials, there is one at i>0 and arbitrary j, then there is also one at (i−1) and j, and if there is one at arbitrary i and j>0, then there is also one at i and (j−1), and the points $P_\beta$ are pairs of non-zero symbols of $F_q$ which have been classified by aggregates as follows when $\beta$ varies from 1 to n:

$(x_1,y_1(x_1)),(x_1,y_2(x_1)),\ldots,(x_1,y_{\lambda_1}(x_1));(x_2,y_1(x_2)),$
   $(x_2,y_2(x_2)),\ldots,(x_2,y_{\lambda_2}(x_2));\ldots;(x_\mu,y_1(x_\mu)),(x_\mu,$
   $y_2(x_\mu)),\ldots,(x_\mu,y_{\lambda_\mu}(x_\mu)),$ where $\mu$ denotes the number of aggregates and, for any i between 1 and $\mu$, $\lambda_i$ denotes the number of pairs with $x_i$ as a first element.

23. An encoding device according to claim 22, further comprising a formatting unit adapted to put the successive words $\underline{v}$ end to end so as to form a continuous chain of data to transmit, and to divide up that chain of data into blocks of predetermined length.

24. An encoding device according to claim 23, in which the codewords are not exactly divisible into blocks, and said formatting unit is capable of completing each incomplete block with a predetermined arbitrary sequence of data.

25. An encoding device according claim 23, in which the codewords are not exactly divisible into blocks, and said formatting unit is capable of completing each incomplete block by copying the value of the data situated at a predetermined number of positions of the corresponding codeword equal to the number of items of data to complete.

26. An encoding device according to claim 25, in which the copied data is situated in the same incomplete block.

27. Apparatus for transmitting encoded digital signals, comprising an encoding device according to any one of claims 22 to 26, means for modulating said encoded digital signals, and a modulated data transmitter.

28. An apparatus according to claim 27, in which said modulation is in accordance with OFDM.

29. A system for telecommunicating data in the form of blocks of predetermined length, comprising:
   at least one apparatus for transmitting encoded digital signals according to claim 27; and
   at least one apparatus for receiving encoded digital signals comprising:
      a modulated data receiver,
      means for demodulating the encoded digital signals,
      a unit, adapted to calculate information symbols, and
      an error correction unit, adapted to coffect transmission errors of the encoded data.

30. An apparatus for recording encoded digital signals, comprising an encoding device according to any one of claims 22 to 26, means for modulating said encoded digital signals, and a modulated data recorder.

31. A system for mass storage, comprising:

at least one apparatus for recording encoded digital signals according to claim 30;

at least one recording medium; and at least one apparatus for reading encoded digital signals comprising:

a modulated data reader, means for demodulating the encoded digital signals, a unit adapted to calculate information symbols, and an error correction unit adapted to correct transmission errors of the encoded data.

* * * * *